United States Patent
Seman, Jr. et al.

(10) Patent No.: US 8,274,261 B2
(45) Date of Patent: Sep. 25, 2012

(54) CELL MONITORING AND BALANCING

(75) Inventors: Andrew E. Seman, Jr., White Marsh, MD (US); Nathan Cruise, Phoenix, MD (US); Daniel J. White, Baltimore, MD (US); David A. Carrier, Aberdeen, MD (US); Daniele C. Brotto, Baltimore, MD (US); Dahn Trinh, Parkville, MD (US); Fugen Qin, Baltimore, MD (US)

(73) Assignee: Black & Decker Inc., Newark, DE (US)

( * ) Notice: Subject to any disclaimer, the term of this patent is extended or adjusted under 35 U.S.C. 154(b) by 222 days.

(21) Appl. No.: 12/170,718

(22) Filed: Jul. 10, 2008

(65) Prior Publication Data

US 2009/0015206 A1    Jan. 15, 2009

Related U.S. Application Data

(60) Provisional application No. 60/949,740, filed on Jul. 13, 2007.

(51) Int. Cl.
*H02J 7/00*      (2006.01)
*G01N 27/416*    (2006.01)

(52) U.S. Cl. ........ 320/134; 320/116; 320/118; 320/122; 320/128; 320/162; 324/426; 324/433; 324/434

(58) Field of Classification Search .................. 320/122, 320/134
See application file for complete search history.

(56) References Cited

U.S. PATENT DOCUMENTS

| | | | |
|---|---|---|---|
| 5,504,415 A * | 4/1996 | Podrazhansky et al. ...... | 320/118 |
| 5,610,495 A | 3/1997 | Yee et al. | |
| 5,677,613 A * | 10/1997 | Perelle .......................... | 320/122 |
| 5,818,201 A | 10/1998 | Stockstad et al. | |
| 5,894,212 A * | 4/1999 | Balogh .......................... | 320/122 |
| 5,952,815 A * | 9/1999 | Rouillard et al. ............. | 320/116 |
| 6,114,835 A | 9/2000 | Price | |
| 6,166,549 A | 12/2000 | Ashtiani et al. | |
| 6,204,634 B1 | 3/2001 | Zimmerman et al. | |
| 6,411,097 B1 | 6/2002 | Ashtiani et al. | |
| 6,459,237 B1 * | 10/2002 | Bausch .......................... | 320/125 |
| 6,462,510 B1 * | 10/2002 | Takada et al. ................. | 320/116 |
| 6,624,612 B1 | 9/2003 | Lundquist | |
| 6,873,134 B2 | 3/2005 | Canter et al. | |

(Continued)

FOREIGN PATENT DOCUMENTS

EP    0863598    9/1998

*Primary Examiner* — Edward Tso
*Assistant Examiner* — Johali Torres Ruiz
(74) *Attorney, Agent, or Firm* — Michael Aronoff; Adan Ayala

(57) ABSTRACT

A method for monitoring the voltage of each of a plurality of cells of a battery pack is provided. The method may include monitoring a voltage potential for each of a plurality of cells in a battery pack utilizing a single channel of battery control unit within the battery pack. If, during discharge of the battery, e.g., the battery is being used to power a hand tool, the voltage potential of any cell is determined by the battery control unit to be below a predetermined minimum voltage, the battery control unit discontinues a current flow from battery pack to the tool. Additionally, during charging of the battery pack, if a voltage differential between any one of the cells and any other one of the cells is determined to be above a predetermined maximum differential, the battery control unit reduces the voltage potential stored in the cell having the higher voltage potential.

2 Claims, 7 Drawing Sheets

U.S. PATENT DOCUMENTS

| | | |
|---|---|---|
| 7,081,737 B2 | 7/2006 | Liu et al. |
| 7,085,338 B2 * | 8/2006 | Huelss .......................... 375/355 |
| 7,248,020 B2 * | 7/2007 | Hidaka et al. ................. 320/134 |
| 7,352,155 B2 * | 4/2008 | Li et al. ........................ 320/118 |
| 2002/0024319 A1 * | 2/2002 | Haraguchi et al. ............ 320/122 |
| 2003/0222619 A1 * | 12/2003 | Formenti et al. .............. 320/119 |
| 2005/0007068 A1 | 1/2005 | Johnson et al. |
| 2005/0062456 A1 * | 3/2005 | Stone et al. ................... 320/116 |

* cited by examiner

CELL MONITORING AND BALANCING

CROSS-REFERENCE TO RELATED APPLICATIONS

This application claims the benefit of U.S. Provisional Application No. 60/949,740, filed on Jul. 13, 2007. The disclosure of the above application is incorporated herein by reference.

FIELD

The present teachings relate generally to a battery pack and, more particularly, to various battery cell monitoring systems and methods.

BACKGROUND

Battery operated devices, such as power tools, appliances, computers, etc., are common place in today's households, offices and work sites. A large percentage of the batteries used to power such devices are constructed as multi-cell battery packs, such as multi-cell NiCd, NiMh or Lithium Ion battery packs. The ever increasing utilization of multi-cell battery packs to power such devices has been accompanied by a demand for increased battery power, extended battery life, and longer battery durability. To achieve increased power, extended life, and longer durability, it is important that the battery packs not be charged significantly above or discharged below a normal charge range for the respective battery. More specifically, it is important that no cell within the respective battery pack be charged significantly above or discharged below a normal charge range for the battery pack.

Ideally, each of the cells within a battery pack will have similar charging, discharging and efficiency characteristics. However, this ideal scenario is not easily achieved and often each battery cell within a battery pack can have different charging, discharging and efficiency characteristics. Such differences in cell characteristics can complicate the issue of overcharging and undercharging of a battery pack, i.e., overcharging and undercharging the cells of a battery pack. For instance, fully charging one battery cell in a battery pack can result in overcharging one or more of the other battery cells in the battery pack. Likewise, ending a charge cycle when only one battery cell is fully charged can result in undercharging one or more of the other battery cells in the battery pack.

The statements in this section merely provide background information related to the present disclosure and can not constitute prior art.

SUMMARY

A method for monitoring the voltage of each of a plurality of cells of a battery pack is provided. In various embodiments, the method includes monitoring a voltage potential for each of a plurality of cells in a battery pack utilizing a single channel of battery control unit within the battery pack. If, during discharge of the battery, e.g., the battery is being used to power a hand tool, the voltage potential of any cell is determined by the battery control unit to be below a predetermined minimum voltage, the battery control unit discontinues a current flow from battery pack to the tool. Additionally, during charging of the battery pack, if a voltage differential between any one of the cells and any other one of the cells is determined by the battery control unit to be above a predetermined maximum differential, the battery control unit reduces the voltage potential stored in the cell having the higher voltage potential.

Further areas of applicability of the present teachings will become apparent from the description provided herein. It should be understood that the description and specific examples are intended for purposes of illustration only and are not intended to limit the scope of the present teachings.

DRAWINGS

Figure 1:
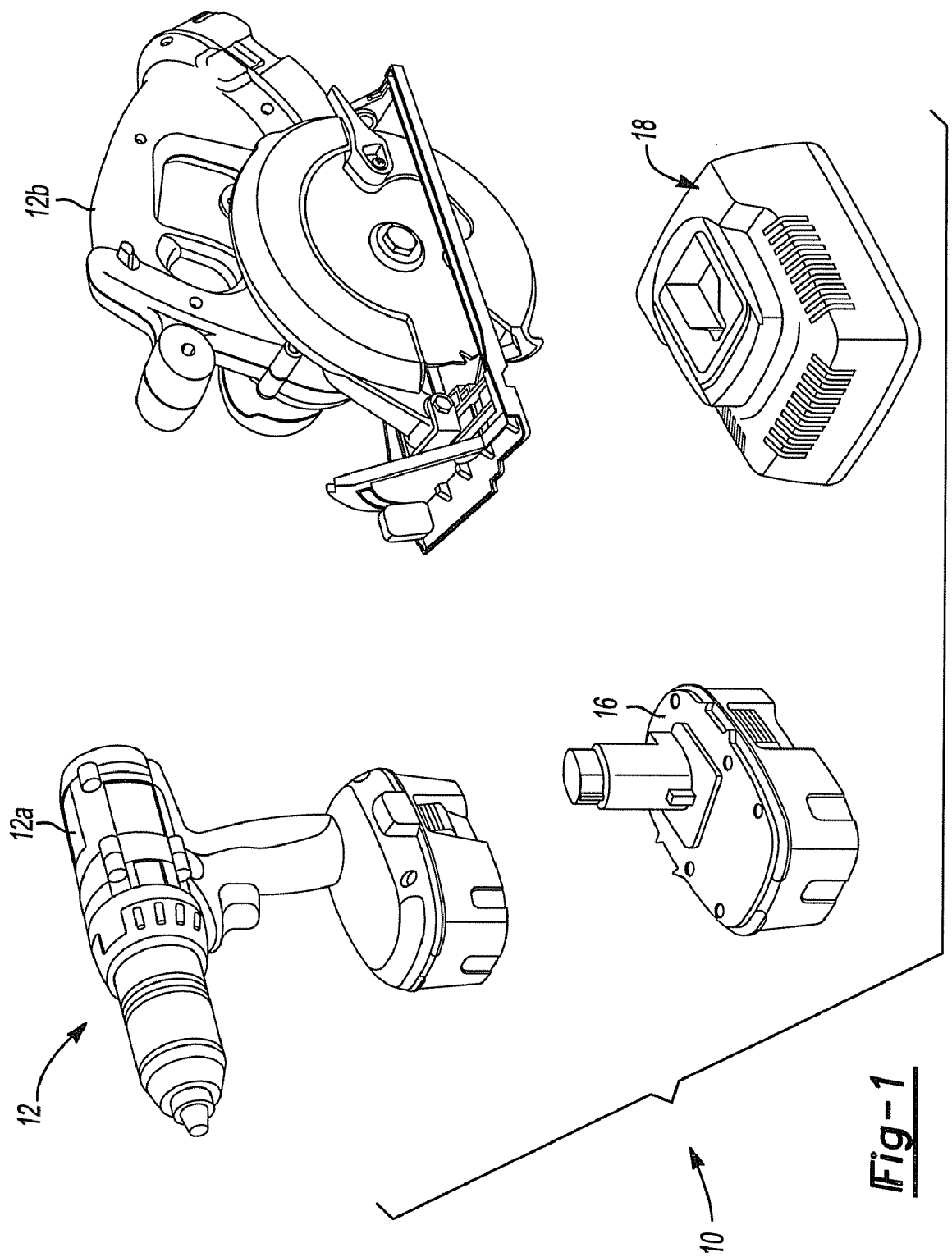
FIG. 1 is a diagram of an exemplary system of power tools, in accordance with various embodiments of the present disclosure.

The drawings described herein are for illustration purposes only and are not intended to limit the scope of the present teachings in any way.

DETAILED DESCRIPTION

The following description is merely exemplary in nature and is in no way intended to limit the present teachings, application, or uses. Throughout this specification, like reference numerals will be used to refer to like elements.

In various embodiments, the present disclosure can relate to a system of power tools of the type that is generally indicated by reference numeral 10 in FIG. 1. The system of power tools 10 can include, for example, one or more power tools 12, a battery pack 16 and a battery pack charger 18. Each of the power tools 12 can be any type of power tool, including without limitation drills, drill/drivers, hammer drill/drivers, rotary hammers, screwdrivers, impact drivers, circular saws, jig saws, reciprocating saws, band saws, cut-off tools, cut-out tools, shears, sanders, vacuums, lights, routers, adhesive dispensers, concrete vibrators, lasers, staplers and nailers. In the particular example provided, the system of power tools 10 includes a first power tool 12a and a second power tool 12b. For example, the first power tool 12a can be a drill/driver similar to that which is described in U.S. Pat. No. 6,431,289, while the second power tool 12b can be a circular saw similar to that which is described in U.S. Pat. No. 6,996,909. The battery pack 16 can be selectively removably coupled to the first and second power tools 12a and 12b to provide electrical power thereto. It is noteworthy that the broader aspects of this disclosure are applicable to other types of battery powered devices, such as home appliances, computers and lawn care equipment.

Figure 2:
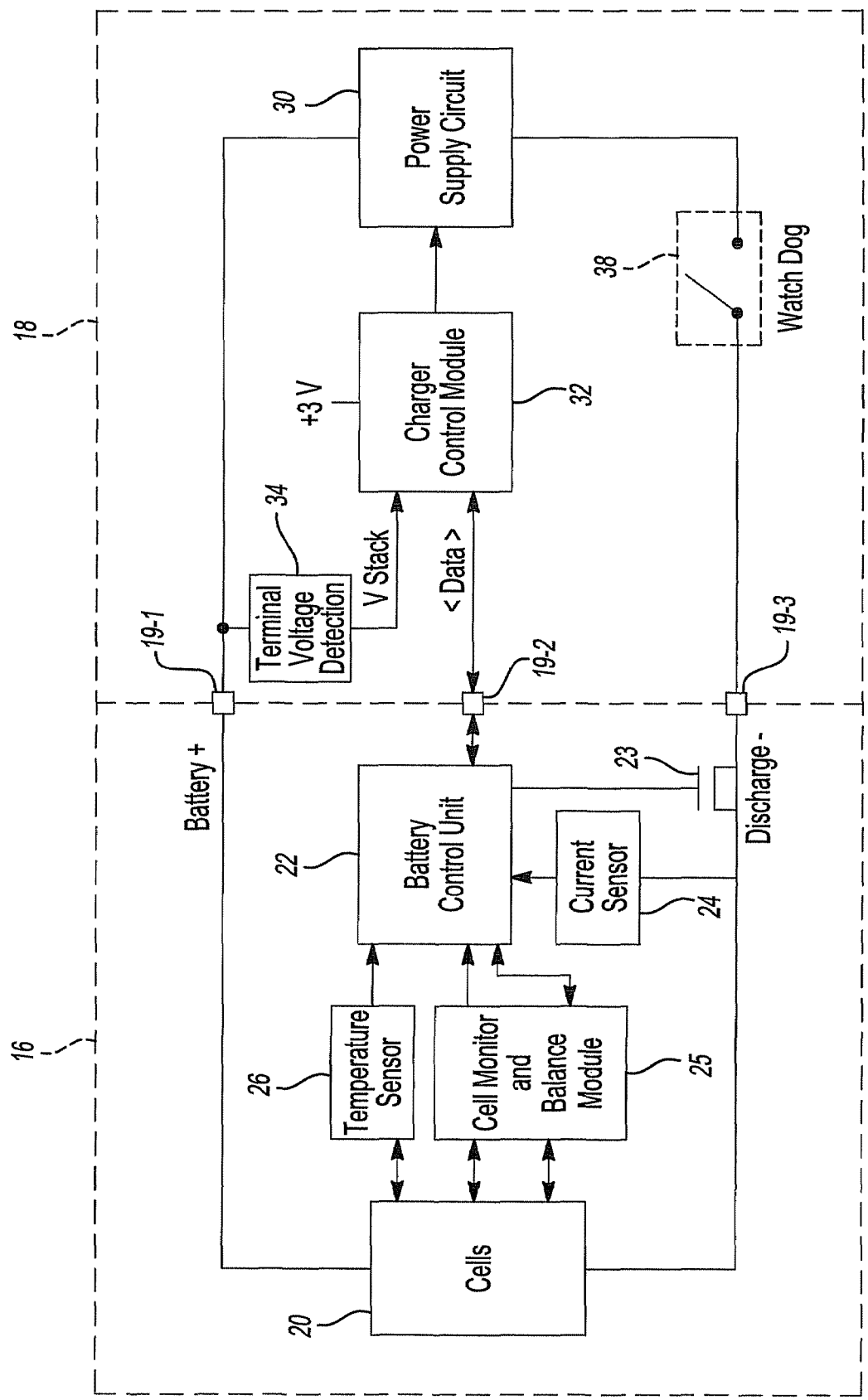
FIG. 2 is a block diagram of an exemplary configuration for a battery pack operably coupled to battery charger, in accordance with various embodiments of the present disclosure.

FIG. 2 illustrates an exemplary configuration of a battery pack 16 operably coupled to a battery charger 18, in accordance with various embodiments of the present disclosure. The battery pack 16 is generally comprised on a plurality of battery cells 20, a battery control unit 22 and various battery control circuits. Except as otherwise described herein, the battery pack 16 can be configured in a manner that is similar to that which is described in U.S. Patent Application Publication No. 2006/0096771 which is hereby incorporated by reference. However, the exemplary configuration is merely provided as a context for describing the various cell 20 monitoring and protection methods and circuits disclosed herein.

The battery pack 16 can include a plurality of battery cells 20 connected in series, and/or a plurality of serially-connected strings of cells, in which the strings are in parallel with one another. For purposes of describing the exemplary embodiments, the battery pack 16 can be composed of cells 20 having lithium-ion cell chemistry. In the context of cordless power tools, the nominal voltage rating of the battery pack is typically 18 volts. However, other voltage ratings are contemplated for different applications. In addition, the battery pack 16 can be composed of cells 20 of another lithium-based chemistry, such as lithium metal or lithium polymer, or other chemistry such as nickel cadmium (NiCd), nickel metal hydride (NiMH) and lead-acid, for example, in terms of the chemistry makeup of individual cells, electrodes and electrolyte of the pack. Although not limited thereto, in the various embodiments described herein, the battery pack 16 is rechargeable.

The battery control unit 22 embedded within the battery pack 16 is operable to, among other things, protect the battery cells 20 and monitor any fault conditions that can develop. In various exemplary embodiments, the battery control unit 22 is implemented in software on a digital microcontroller. However, the battery control unit 22 can be embodied in hardware or software as a digital microcontroller, a microprocessor or an analog circuit, a digital signal processor or by one or more digital ICs such as application specific integrated circuits (ASICs), for example.

Discharge current from the battery cells 20 and charge current to the battery cells 20 can be clamped or discontinued through the use of a switch 23. The switch 23 can be placed in series with the battery cells 20 on the low voltage side of the battery cells 20. The switch 23 can then be controlled by the battery control unit 22 to interrupt current flow to/from the battery cells 20. The switch 23 can be any switch suitable to interrupt current flow to and from the battery pack 16. For example, the switch 23 can be a transistor (e.g., a MOSFET). Other types of switches are also contemplated by this disclosure.

A current sensor 24 is configured to sense the current being supplied by the battery pack 16 (i.e., the cells 20) and provide a signal indicative of the sensed current to the battery control unit 22. In various implementations, the current sensor 24 can be implemented using a current shunt disposed in series with the battery cells 20. The current shunt can be positioned on the low voltage side of the battery cells 20. Alternatively, the switch 23 can be used as the current sensor (see FIG. 3). In other words, one of the many operations of the battery control unit 22 is to monitor the current being drawn across the switch 23. In embodiments where the switch 23 is a transistor, the current is measured using the resistance $R_{on}$ as a current shunt that converts the current into a voltage that can be read by the battery control unit 22. Other types of current sensors (e.g., a Hall effect current sensor) are also within the scope of this disclosure.

In various embodiments, the battery pack 16 can further include a cell voltage monitoring and balancing module 25 operable to sense the voltage of each individual cell 20 and also sense total pack, or stack, voltage of the cells 20. The cell voltage monitoring and balancing module 25 provides a signal representing the individual cell voltages and/or the stack voltage of the battery 16 to the battery control unit 22. Alternatively, the battery control unit 22 can direct the cell voltage monitoring and balancing module 25 to periodically measure the cell voltage across each cell 20 of the pack 16 and the total pack voltage in a sequential manner. Additionally, the cell voltage monitoring and balancing module 25 interfaces with the battery control unit 22 to control balancing of the voltage potentials of each cell 20 during the charging process, as described in detail below.

In various forms, the battery pack 16 further includes a temperature sensor 27 operable to measure the temperature of each of the battery cells 20, or groups of the cells 20. The temperature sensor 27 in turn communicates the measured temperatures to the battery control unit 22. The temperature sensor 27 can be implemented with a negative temperature coefficient (NTC) thermistor, a positive temperature coefficient (PTC) thermistor, temperature sensing integrated circuits, or thermocouples.

The battery pack 16 is structured to be removably connectable to the battery pack charger 18 to charge the battery cells 20. In various embodiments, the battery pack charger 18 generally includes a power supply circuit 30 and a charger control module 32. Additionally, the battery pack charger 18 can include a terminal voltage detection circuit 34 and a watchdog circuit 38. It is envisioned that other sensing and/or protections circuits can also be incorporated in the battery charger 18. However, this exemplary configuration is merely provided as a context for describing the various monitoring and protection methods and circuits disclosed herein.

Generally, the charger control module 32 is operable to charge the battery cells 20 and monitor any fault conditions which may develop. In various embodiments, the charger control module 32 is implemented in software on a digital microcontroller. However, the charger control module 32 can be embodied in hardware or software as a digital microcontroller, a microprocessor or an analog circuit, a digital signal processor or by one or more digital ICs such as application specific integrated circuits (ASICs), for example.

The charger control module 32 and the battery control unit 22 can exchange data through a data terminal 19-2. This data terminal provides a serial data link between the charger control module 32 and the battery control unit 22. For example, diagnostic measures made in the battery pack 16 can be passed by the battery control unit 22 to the charger control module 32, via the data terminal 19-2. Conversely, control parameters can be passed from the charger control module 32 to the battery control unit 22, via the data terminal 19-2. Exchanged data can include, but is not limited to, an identifier for the charger and/or battery pack, individual cell and/or total stack voltage, temperature conditions in the pack, etc. Other types of communications are also contemplated by this disclosure.

Figure 3:
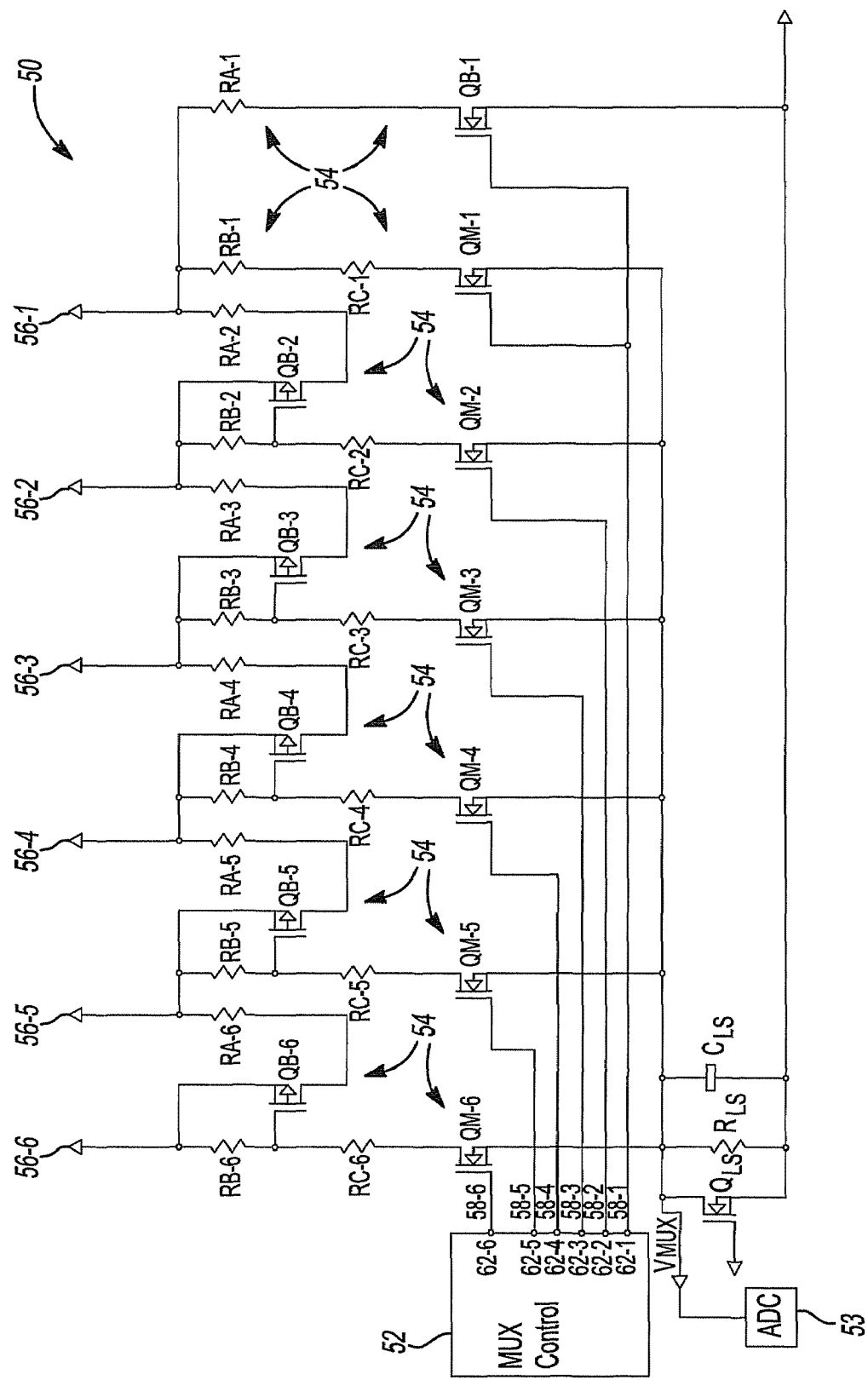
FIG. 3 is a diagram illustrating an exemplary cell monitoring and balancing circuit included in the battery pack shown in FIG. 2, in accordance with various embodiments of the present disclosure.

Referring now to FIG. 3, in various embodiments, the cell monitoring and balancing module 25 includes a monitoring and balancing circuit 50 coupled to a multiplexer controller 52 and coupled to a single analog-to-digital converter (ADC) 53. The monitoring and balancing circuit 50 includes a plurality of monitoring and balancing (M&B) sub-circuits 54.

More particularly, the monitoring and balancing circuit 50 includes an M&B sub-circuit 54 for each cell 20 of the battery 16. For example, the exemplary monitoring and balancing circuit 50 to be implemented with an exemplary battery 16 having six cells 20, thus includes six M&B sub-circuits 54-1 through 54-6. Each M&B sub-circuit 54 is interposed between a corresponding one of a plurality of cell nodes 56 (e.g., 56-1 through 56-6) and a corresponding one of a plurality of control lines 58 (e.g., 58-1 through 58-6). Each node 56 is connected to a respective one of the cells 20 and each control line 58 is coupled to a respective channel 62 port (e.g., 62-1 through 62-6) of a multiplexer 52. The output line $V_{MUX}$ presents the selected node voltage of the monitoring and balancing circuit 50 and that voltage is input to the ADC 53 to provide voltage measurements for battery control unit 22. Tied between the $V_{MUX}$ output line and ground is a low side resistor $R_{LS}$ common to each M&B sub-circuit 54, and a low side capacitor $C_{LS}$ in parallel with the low side resistor $R_{LS}$ that smoothes the voltage readings on $V_{MUX}$.

Implementation of the multiplexer controller 52 to operate each M&B sub-circuit 54 of the monitoring and balancing circuit 50 allows the cell monitoring and balancing module 25 to monitor during discharging, and monitor and balance during charging, each individual cell 20 utilizing a single ADC, e.g., ADC 53. That is, the multiplexer controller 52 allows the battery control unit 22 to individually monitor each cell 20 using a single ADC 53 coupled to a single channel of the battery control unit 22. Additionally, utilizing a single ADC provides highly accurate voltage readings during the monitoring and balancing process described herein.

Each M&B sub-circuit 54 includes a first resistor RA connected to drain of cell balancing field effect transistor (FET) QB. In accordance with various embodiments, each first resistor RA-1 through RA-6 has the same rated resistance value, e.g., 100 ohms. The gate of each cell balancing FET QA is center taped between a second resistor RB and third resistor BC. The outer leg of each third resistor RC is tied to the drain of a cell monitoring FET QM and the gate of each cell monitoring FET QM is connected to the respective control line 58 and thus, tied to the respective channel 62 port of the multiplexer controller 52. The outer leg of each second resistor RB is connected to the source of each respective cell balancing FET QB and to the respective node 56.

Generally, during discharge of the battery 16, the cell monitoring and balancing module 25 monitors the voltage across each cell 20 to prevent any of the cells 20 from being discharged below a predetermined minimum voltage, e.g., 3 volts. More specifically, the battery control unit 22 communicates with the multiplexer controller 52 to sample the voltage across each cell 20 at a particular rate while the battery pack 16 discharging, via the monitoring and balancing circuit 50. If, during discharge, the voltage across any cell 20 drops to the predetermined minimum voltage, the battery control unit 22 will open the switch 23 (FIG. 1) to discontinue current flow from the battery cells 20.

During charging and balancing of the battery pack 16, the charger control module 32, via the battery control unit 22, communicates with the cell monitoring and balancing module 25 to monitor and balance the stored voltage of each cell 20 to prevent any cell 20 from being overcharged. More specifically, the charger control module 32 communicates with the battery control unit 22 through the data terminal 19-2, and the battery control unit 22 communicates with the multiplexer controller 52 to monitor the voltage stored in each cell 20, via the monitoring and balancing circuit 50. If the voltage stored in any of the cells 20 exceeds a maximum limit, e.g., 18 volts, or if the voltage differential between any of cells 20 is greater than a specific amount, e.g., 0.5 volts, the charger control module 32 commands the cell monitoring and balancing module 25 to balance the voltage across all the cells 20 by consuming voltage from those cells 20 with voltages that exceed the particular limit.

To monitor the voltage of each cell 20 during the discharge and charge/balance modes, the battery control unit 22 executes a voltage monitoring algorithm that sequentially selects each of the multiplexer channels 62. Upon selection of a channel 62 the respective cell monitoring FET QM is turned on allowing current to flow through the second and third resistors RB and RC of the respective M&B sub-circuit 54. Subsequently, the node voltage at each node 56 can be determined based on the voltages across each of the resistors RB, RC and RLS in the respective M&B sub-circuit 54. Thus, the node voltage at each node 56-1 through 56-6 is measured and stored in memory of the battery pack 16.

In accordance with the exemplary monitoring and balancing circuit 50 illustrated in FIG. 3, the cell voltage, or voltage potential, of the cell 20 connected to the first selected node 56 would be equal to the node voltage measured at that particular node 56. However, to determine the voltage for each of the remaining subsequently selected cells 20, the battery control unit 22 subtracts the node voltage of the preceding node 56 from the node voltage of node 56 for which the cell voltage measurement is desired, (e.g., $V_{cell(x)}=V_{node(x)}-V_{node(x-1)}$). For example, if the battery control unit 22 sequentially selects channel 62-1 through 62-6, starting with channel 62-1 and ending with channel 62-2, then the cell voltage of the cell 20 connected to node 56-1 would be equal to the node voltage at node 56-1. Subsequently, to determine the cell voltage of the cell 20 connected to node 56-2, the battery control unit 22 subtracts the node voltage at node 56-1 from the node voltage at node 56-2. And, to determine the voltage potential of the cell 20 connected to node 56-3, the battery control unit 22 subtracts the node voltage at node 56-2 from the node voltage at not 56-3, and so on, until the cell voltage for each individual cell 20 is determined. It should be noted that structuring the monitoring and balancing circuit 50 to include the common low side resistor $R_{LS}$ standardizes the error for each channel 62 and thus, provides very accurate voltage measurement for each of the cells 20.

In various embodiments, the battery control unit 22 executes a digital filtering algorithm, e.g., an integrating filter, to filter each of the node voltage readings as they are collected, i.e., smooth the signals input to the battery control unit 22. The filtering operation is performed as each node voltage is measured and prior to the calculation of the cell voltages, as described above. Filtering the node voltage readings prior to calculation of the respective cell voltages provides highly accurate cell voltage calculations. The digital filtering algorithm can be an independent algorithm executed in coordination with execution of the voltage monitoring algorithm or alternatively, the digital filtering algorithm can be incorporated as a sub-routine of the voltage monitoring algorithm and remain within the scope of the present disclosure.

To conserve the energy stored in battery pack 16 during discharge mode, the voltage monitoring algorithm samples each node voltage at a high rate, i.e., each channel 62 is activated very briefly to read the respective node voltage. Additionally, during discharge mode, each channel 62 is sequentially activated such that only a single channel is activated at one time. Conversely, during charge/balance mode, the voltage monitoring algorithm can simultaneously activate two or more channels 62 and can activate the channels 62 for a longer period to allow for cell balancing if necessary.

Generally, during the charge/balance mode, the cell voltage for each cell 20 is calculated as described above. If, during charging, the voltage of any cell 20 is determined to exceed the maximum limit, or the voltage differential between any two of the cells 20 is greater than the specified amount, a shunt current is applied to the respective cell 20 to consume the 'excess' energy from the one or more cells 20 having 'excess' stored voltage potential. More particularly, if the voltage potential of any one or more cells 20 is/are determined to be too high, the charger control module 32, via the multiplexer controller 52, turns on the cell balancing FET QB of the respective M&B sub-circuit(s) 54. Turning on the respective cell balancing FET(s) QB allows current from the respective cell(s) 20 to flow through the respective first resistor(s) RA, thereby converting the 'excess' energy, i.e., 'excess' voltage potential, into heat. Thus, during the charge/balance mode, the sampling rate of the cells 20 is much longer than in the discharge mode to allow for balancing of the cell voltages and prevent overcharging any cell 20.

In various embodiments, the monitoring and balancing circuit 50 additionally includes a low side FET $Q_{LS}$ that is turned on during charge/balance mode to allow more than one of the second FETs QB-1 through QB-6 to be simultaneously tuned on to balance the cells 20. More particularly, the low side FET $Q_{LS}$ effectively grounds the $V_{MUX}$ line when more than one second FET QB is turned on during cell balancing to prevent the voltage on $V_{MUX}$ from exceeding a rated limit.

Figure 4:
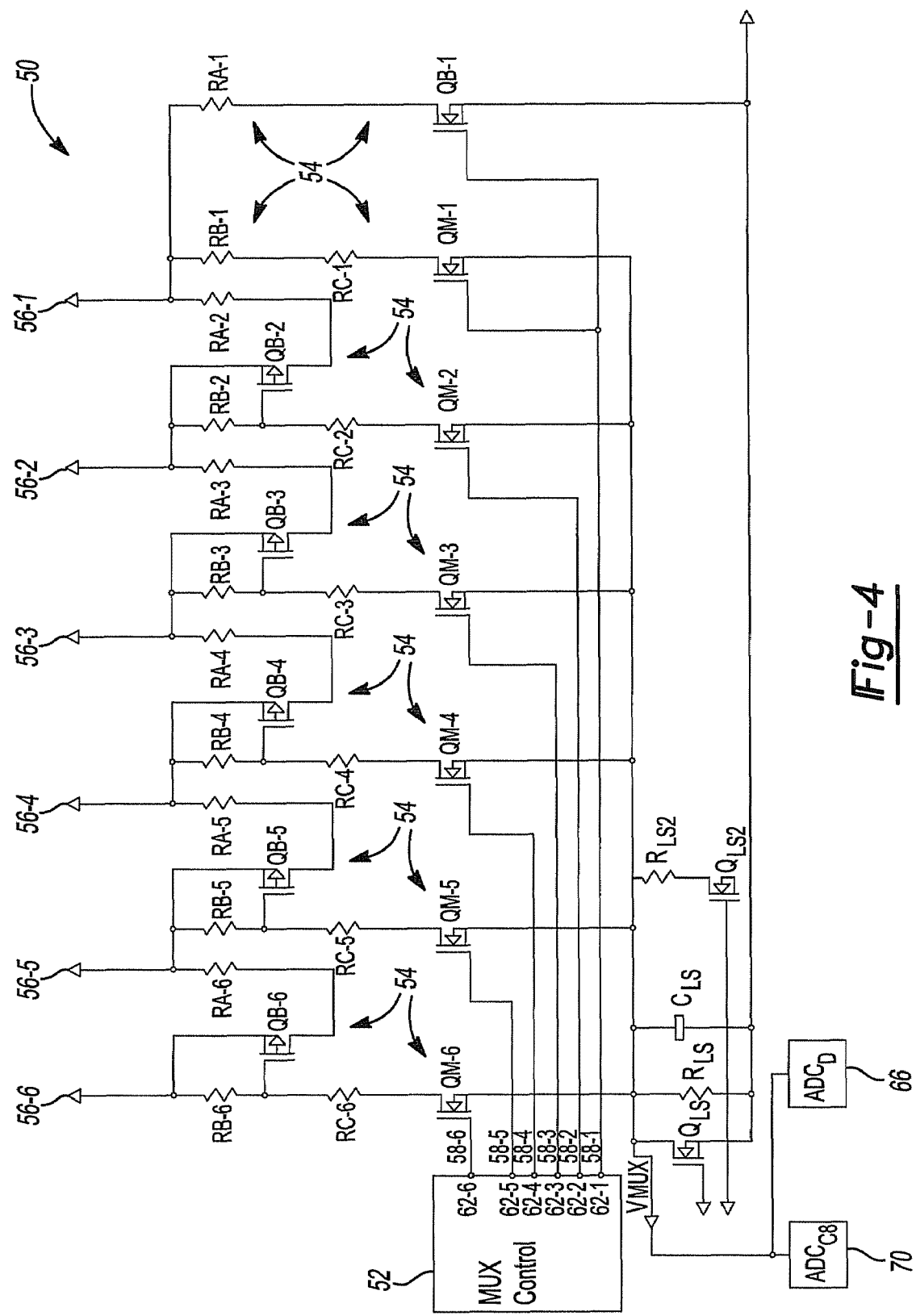
FIG. 4 is a diagram illustrating the exemplary cell monitoring and balancing circuit shown in FIG. 4, in accordance with other various embodiments of the present disclosure.

As described above, during the discharge mode, the voltage monitoring algorithm samples each node voltage at a high rate, and during charging/balancing, the node voltages are sampled at a much slower rate. As illustrated in FIG. 4, to accommodate for the two different sampling rates and to increase the measuring capability of the monitoring and balancing circuit 50, in various embodiments, the monitoring and balancing module 25 includes a discharge mode ADC 66 connected to Vmux and a charge/balance mode ADC 70 connected to Vmux. Additionally, the charging and balancing circuit 50 includes a second low side resistor $R_{LS2}$ and a second low side FET $Q_{LS2}$ controlled by cell monitoring and balancing module 25.

During the discharge mode, the discharge mode ADC 66 is utilized with the multiplexer controller 52 to sample the node voltages of the cells 20, as described above, at a first, less accurate, sample rate, also referred to herein as the fast sample rate. Conversely, during the charge/balance mode, the charge/balance mode ADC 70 is utilized with the multiplexer controller 52 to sample the node voltages of the cells 20, as described above, at a second, more accurate, sample rate that is slower than the first sample rate, also referred to herein as the slow sample rate. To further increase accuracy during the charge/balance mode, the second low side resistor $R_{LS2}$ and the second low side FET $Q_{LS2}$ can be turned on by the cell monitoring and balancing module 25 to change the voltage scale at which the node voltages are measured. That is, during discharge, the node voltages can be sampled using the discharge ADC 66 at the fast sample rate and over a larger, less accurate, voltage range. However, during charging/balancing, the node voltages can be sampled using the charge/balance ADC 70 at the slow sample rate over a smaller, more accurate, voltage range. More specifically, during the charge/balance mode, the second low side resistor $R_{LS2}$ and $FET_{LS2}$ can be turned on and off to change the voltage range at which the node voltages are measured. Thus, if the voltage ratio of the cells 20 exceeds a certain predetermined limit, the cell monitoring and balancing module 25 can turn on the second low side FET $Q_{LS2}$ allowing current to flow through the second low side resistor $R_{LS2}$, thereby changing the scale at which the node voltages are sampled and reducing the voltage ratio of cells 20.

Figure 5:
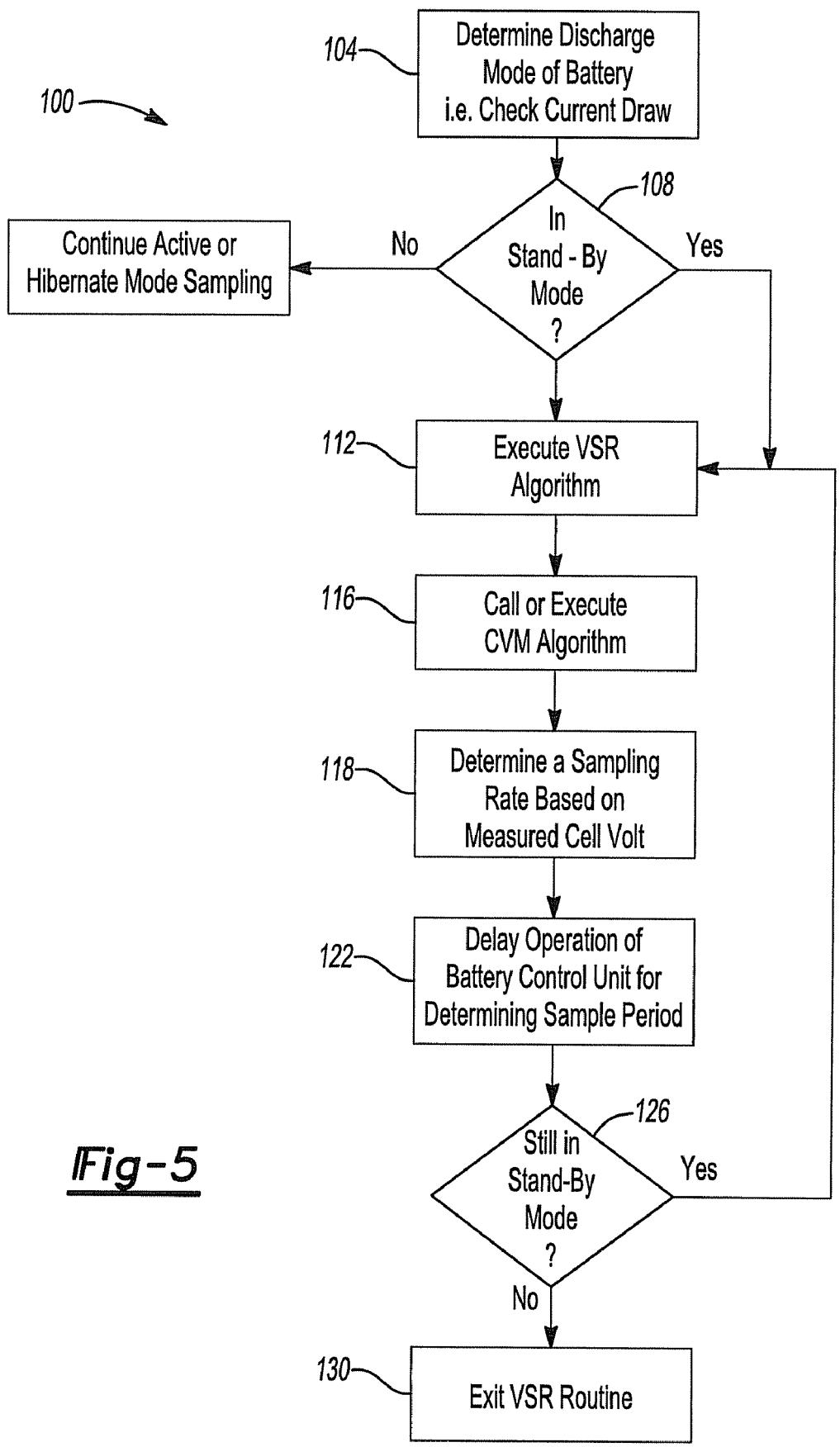
FIG. 5 is a flow chart illustrating a method of varying the rate at which cell voltages for the battery pack shown in FIG. 2 are sampled during discharge of the cells, in accordance with various embodiments of the present disclosure.

Referring now to FIG. 5, in various embodiments, during discharge of the battery 16, i.e., when the battery is installed in the tool 12 or removed from the tool 12 but not being charged, the battery control unit 22 can execute a variable sample rate algorithm to conserve the consumption of energy stored in the battery cells 20. The variable sample rate algorithm is implemented along with a cell voltage monitoring algorithm, for example the cell voltage monitoring system described above, to vary the rate at which the voltages of the cells 20 are sampled during battery discharge. It is envisioned that it is entirely within the scope of the present disclosure that the variable sample rate algorithm can be implemented as a control routine for such a cell voltage monitoring algorithm, as a sub-routine of such a cell voltage monitoring algorithm, or as an independent algorithm executed separately from a cell voltage monitoring algorithm.

In various embodiments, when the battery pack 16 is not being charged, the battery control unit 22 executes a discharge mode algorithm to determine in which of three discharge modes the battery pack 16 is presently exists. Particularly, based on the current draw on the battery pack 16, the discharge mode algorithm determines whether the battery is in an active discharge mode, a standby discharge mode or a hibernation discharge mode. When in the active discharge mode, the battery pack 16 is installed in a tool or device and under a load. In active discharge mode the battery control unit 22 samples the cell voltages at a high rate utilizing any suitable cell voltage monitoring algorithm or sub-routine to prevent any of the cells 20 from being overly discharged. When in the hibernate mode, the battery pack 16 is completely discharged and the output voltage on the battery terminals has been turned off to preserve any remaining charge in the cells 20. Accordingly, in hibernate mode the cell voltages are no longer sampled.

When in the standby discharge mode the battery 16 is not under a load, e.g., installed in a tool 12 not being used or removed from the tool 12 sitting on a bench or shelf. In standby discharge mode, the battery control unit 22 samples the cell voltage at a variable reduced rate utilizing the variable sample rate algorithm. Generally, based on the measured voltage of the cells 20, or any other desirable cell parameter, the variable sample rate algorithm varies the rate at which the cell voltages are measured. Thus, the frequency at which cell voltage monitoring algorithm, or sub-routine, is executed is a function of the previously measured cell voltages. Alternatively, the sample rate algorithm could vary the rate at which the cell voltages are measured based on a cell parameter other than voltage, e.g., current or temperature, and remain within the scope of the present disclosure. However, for simplicity and clarity, the sample rate algorithm will be described herein to vary frequency at which cell voltage monitoring algorithm, or sub-routine, is called, or executed, as a function of the previously measured cell voltages.

Generally, if the cells 20 are fully charged (e.g. approximately 3 volts/cell) the variable sample rate algorithm will call or execute the cell voltage monitoring algorithm, or sub-routine, at a slower rate than if the cells 20 were at half charged voltage level (e.g., approximately 1.5 volts/cell). And, if the cells 20 were close to being fully discharged (e.g., approximately 0.8 volts/cell) the variable sample rate algorithm will call or execute the cell voltage monitoring algorithm, or sub-routine, at a very fast rate.

More specifically, FIG. 5 shows a flow chart 100 illustrating the method of varying the voltage sampling rate for the cells 20 of the battery pack 16, in accordance with various embodiments. Initially, the battery control unit 22 determines which of the three discharge modes the battery pack 16 is in, as indicated at 104. For example, the battery control unit 22 can determine the discharge mode by measuring the current draw on the battery pack 16. As indicated at 108, if the battery pack 16 is determined to be in the active mode, the battery control unit 22 continues to check the cell voltages at a constant predetermined frequency, or if the battery pack is in hibernation mode, the battery control unit 22 discontinues checking the cell voltages. If the battery pack 16 is determined to be in the stand-by mode, the battery control unit 22 executes the variable sampling rate (VSR) algorithm, as indicated at 112.

Upon execution of the VSR algorithm, the VSR algorithm calls, or executes, a cell voltage monitoring (CVM) algorithm, or sub-routine, to measure the voltage on each cell 20, as indicated at 116. Then based on the measured cell voltages, the VSR algorithm determines a rate at which to subsequently sample the cell voltages, as indicated at 120. That is, the VSR algorithm determines a sample period, i.e., a delay time, before the CVM algorithm, or sub-routine, is re-called, or re-executed, to measure the cell voltages again. The VSR algorithm then delays operation of the battery control unit 22 for the determined sample period, as indicated at 122. Upon expiration of the sample period, the battery control unit checks the discharge mode of the battery pack 16 and if the battery is still in the stand-by mode, the VSR algorithm loops back to re-call, or re-execute the CVM algorithm, or sub-routine, as indicated at 126. Otherwise, if the battery pack is no longer in stand-by mode, the battery control unit 22 exits the VSR algorithm, as indicated at 130.

Figure 6:
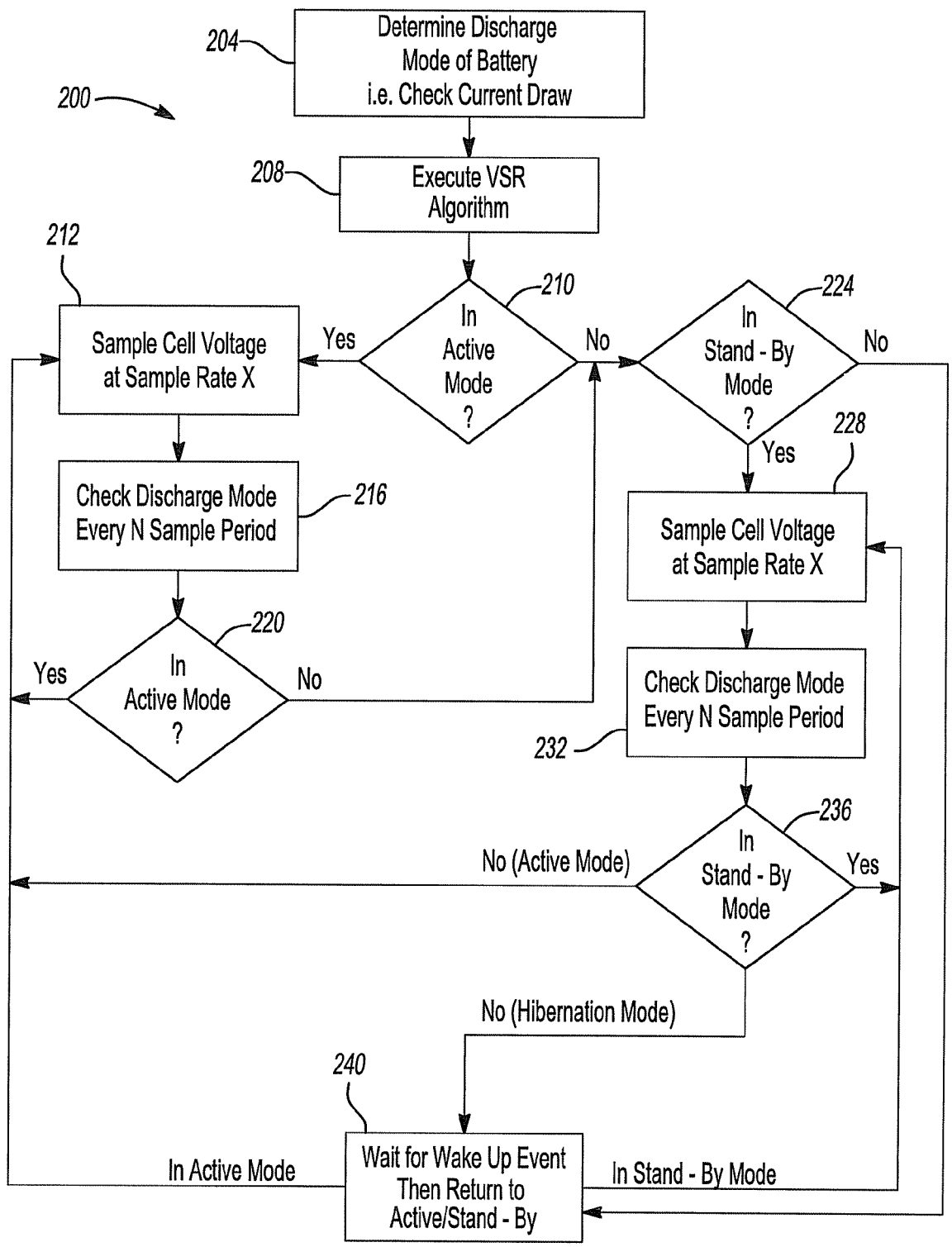
FIG. 6 is a flow chart illustrating a method of varying the rate at which cell voltages for the battery pack shown in FIG. 2 are sampled during discharge of the cells, in accordance with various other embodiments of the present disclosure.

To determine the sample period when the battery pack is in the stand-by mode, the VSR algorithm can derive the sample period by accessing one or more look-up tables; applying conditional predetermined thresholds, such as thresholds relating to voltage, current draw or temperature of the battery; implementing a mathematical equation; or any combination thereof. For, example, the VSR algorithm can determine sampling rate in accordance with one of the following combination threshold based logic and mathematical equations:

$$\text{If } (V_{cell} < V_{th} \text{ and } V_{cell} > V_{tl}) \text{ then the sample period} = k^* (V_{cell} - V_{tl}) + C \quad (1)$$

or $$\text{If } (V_{cell} < V_{th} \text{ and } V_{cell} > V_{tl}) \text{ then the sample period} = \frac{k}{(V_{cell} - V_{tl})} + C \quad (2)$$

or $$\text{If } (V_{cell} < V_{th} \text{ and } V_{cell} > V_{tl}) \text{ then the sample period} = TV^*(V_{cell} - V_{tl}) \quad (3)$$

where, $V_{cell}$=average voltage of the battery pack cells; $V_{th}$=a predetermined high voltage threshold; $V_{tl}$=a predetermined low voltage threshold; k=some constant related to the delay time; C=minimum delay constant; and TV=look-up table value In other embodiments, the variable sample rate (VSR) algorithm can vary the rate at which the voltage on the cells 20 of battery pack 16 are sampled in accordance with flow chart 200 illustrated in FIG. 6. Initially, the battery control unit 22 determines which of the three discharge modes the battery pack 16 is in, as indicated at 204. For example, the battery control unit 22 can determine the discharge mode by measuring the current draw on the battery pack 16. The VSR algorithm is then executed, as indicated at 208. As indicated at 210 and 212, if the battery pack 16 is in active mode, the VSR algorithm sets the cell voltage sample rate to a predetermined constant rate X, e.g., every 10 milli-seconds, and calls, or executes, a cell voltage monitoring (CVM) algorithm, or sub-routine, to begin sampling the cell voltages at the sample rate X. Additionally, the VSR algorithm will check the discharge mode of the battery pack 16 every M number of samples periods, e.g., every 10 sample periods, as indicated at 216. As indicated at 220, if the battery pack 16 is still in the active mode, the VSR algorithm continues to call, or execute, the CVM algorithm, or sub-routine, to continue sampling the cell voltages at the sample rate X.

As indicated at 210, 220, 224 and 228, if the battery pack 16 is determined to not be in the active mode, but rather in the stand-by mode, the VSR algorithm sets the cell voltage sample rate to a predetermined constant rate Y that is much slower than active mode sample rate of X, e.g., every 1 second, and calls, or executes, the CVM algorithm, or sub-routine, to begin sampling the cell voltages at the sample rate Y. The VSR algorithm will then check the discharge mode of the battery pack 16 every N number of samples periods, e.g., every 10 sample periods, as indicated at 232. As indicated at 236, if the battery pack 16 is still in the stand-by mode, the VSR algorithm continues to call, or execute, the CVM algorithm, or sub-routine, to continue sampling the cell voltages at the sample rate Y. As indicated at 236 and 212, if the battery pack determined to be in the active mode, the VSR algorithm sets the cell voltage sample rate to the predetermined constant rate X, and calls, or executes, the CVM algorithm, or sub-routine, to begin sampling the cell voltages at the sample rate X.

If the battery pack 16 is determined to be in the hibernate mode, the VSR algorithm sets the cell voltage sample rate to zero, and ceases checking the cell voltages. As indicated at 240, if the battery pack is in hibernate mode it will wait for another stimuli to return to active or standby mode e.g. place in a tool, charger or other condition.

Figure 7:
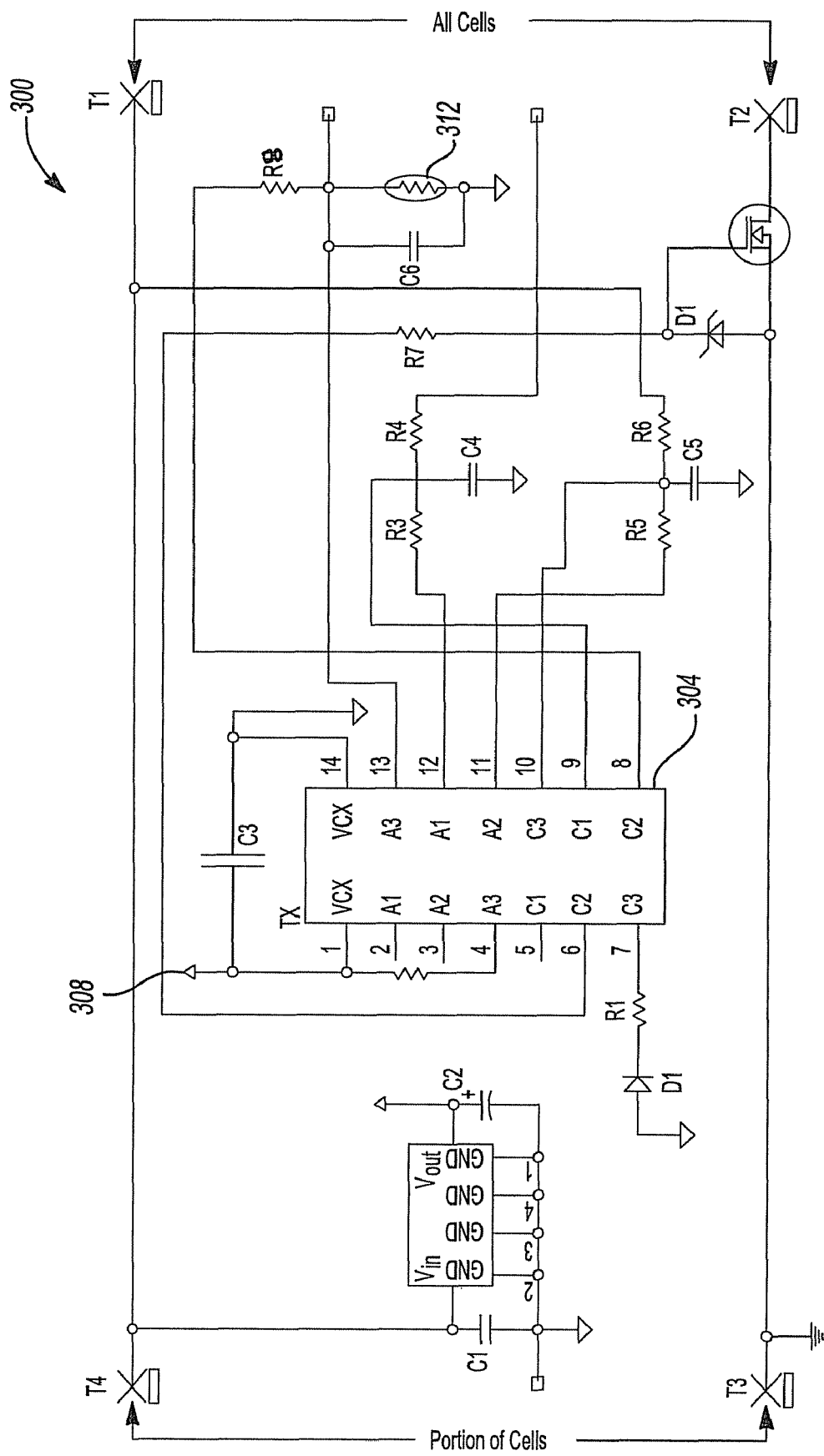
FIG. 7 is a diagram illustrating an exemplary battery cell imbalance detection and control circuit included in the battery pack shown in FIG. 2, in accordance with yet other various embodiments of the present disclosure.

Referring now to FIG. 7, in various embodiments the cell monitoring and balancing module 25 includes a battery cell imbalance detection and control (CIDC) circuit 300. Generally, the CIDC circuit 300 includes a controller 304 that can be communicatively linked to the battery control unit 22 at signal line 308. The controller 304 can be embodied in hardware or software as a digital microcontroller, a microprocessor or an analog circuit, a digital signal processor or by one or more digital ICs such as application specific integrated circuits (ASICs), for example. The CIDC circuit 300 protects against damage to the battery pack 16 by preventing the voltage of any of the cells 20 from dropping below that of the rest of the cells 20 as the cells 20 are being discharged. More particularly, if the CIDC circuit 300 senses that the voltage potential of a cell 20 is a predetermined amount less than other cells 20 in the battery pack 16, the CIDC circuit 300 terminates discharge of the battery pack 16.

In operation, at a predetermined temporal frequency, the CIDC circuit 300 senses the cumulative voltage $V_{all}$ across all cells 20 at terminals T1 and T2 and senses the cumulative voltage $V_{frac}$ across a predetermined fraction, or sub-set, of the cells 20, e.g., the cumulative voltage $V_{1/2}$ across ½ of the cells 20, at terminals T3 and T4. The controller 304 then multiplies the voltage $V_{all}$ by the predetermined fraction to determine a calculated voltage $V_{Cfrac}$ across the predetermined fraction of cells 20. Subsequently, the controller 304 subtracts $V_{frac}$ from $V_{Cfrac}$ to determine a differential D between the measured voltage $V_{frac}$ across the fraction of the cells 20 and the calculated voltage $V_{Cfrac}$ across the fraction of the cells 20. Then based on the differential D, the controller 304 will either continue to sense, calculate and compare the measured voltage $V_{frac}$ and the calculated voltage $V_{Cfrac}$, or terminate discharging of the battery pack 16.

More specifically, if the differential D is approximately equal to zero, or less than a predetermined threshold, then the controller 304 concludes that the voltage of each cell 20 is approximately equal and allows discharge of the battery pack 16 to continue. However, if the differential D is not approximately equal to zero, or is greater than the predetermined threshold, then the controller 304 concludes that at least one of the cells 20 has a lower voltage potential than some or all of the other cells 20. Particularly, if the differential D is a positive number, the controller 304 concludes that the voltage of a cell 20 among the fraction of the cells 20 for which the voltage was measured is low. However, if the differential D is a negative number, the controller 304 concludes that the voltage of a cell 20 not among the fraction of the cells 20 for which the voltage was measured is low. Furthermore, if the differential D is not approximately equal to zero, or is greater than the predetermined threshold, the controller 304 will determine whether the voltage on the 'low' cell 20 is at or below a minimum voltage level. And, if the voltage level of 'low' cell 20 is below the minimum voltage level, the controller 304 will terminate discharge of the battery pack 16.

For example, if the fraction of cells 20 across which the cumulative voltage is monitored was predetermined to be ½, then the controller 304 would sense the cumulative $V_{all}$ across all cells 20 at terminals T1 and T2 and sense the cumulative voltage $V_{1/2}$ across one-half of the cells 20 at terminals T3 and T4. The controller 304 would then multiply the voltage $V_{all}$ by ½ (i.e., divide $V_{all}$ by 2) to determine a calculated voltage $V_{C1/2}$ across one-half of cells 20. Subsequently, the controller 304 would subtract $V_{1/2}$ from $V_{C1/2}$ to determine a differential D between the measured voltage $V_{1/2}$ across one-half of the cells 20 and the calculated voltage $V_{C1/2}$ across one-half of the cells 20. Then, as described above, based on the differential D, the controller 304 will either continue to sense, calculate and compare the measured voltage $V_{frac}$ and the calculated voltage $V_{Cfrac}$, or terminate discharging of the battery pack 16.

In various embodiments, the CIDC circuit 300 can include a temperature sensor 312 operable to measure the temperature of each of the battery cells 20, or groups of the cells 20. The temperature sensor 312 communicates with the controller 304 and if the temperature of any cell 20 or group of cells 20 is sensed to exceed a predetermined threshold, the controller 304 will terminate discharge of the battery pack 16. The temperature sensor 312 can be implemented with a negative temperature coefficient (NTC) thermistor, a positive temperature coefficient (PTC) thermistor, temperature sensing integrated circuits, or thermocouples.

In various implementations, the controller 304 can communicate with the battery control unit 22 to provide a user with battery pack status/state information. For example, if the controller 304 terminates discharge of the battery pack when the voltage potential of one or more cells 20 is sensed to be less than that of any remaining cell 20, as described above, the battery control unit 22 can illuminate a LED indicating that the battery pack needs to be recharged. Or, if the controller 304 determines that the voltage potential of one or more cells 20 is less than that of any remaining cell 20, the controller 304 can terminate discharge of the battery pack 16 by pulsing a switch in such a manner as to mimic what a user would observe as a naturally dying battery pack 16.

The description herein is merely exemplary in nature and, thus, variations that do not depart from the gist of that which is described are intended to be within the scope of the teachings. Such variations are not to be regarded as a departure from the spirit and scope of the teachings.

What is claimed is:

1. A method for monitoring the voltage of each of a plurality of cells of a battery pack, comprising:

monitoring a voltage potential for each of a plurality of cells in a battery pack utilizing a single channel of a battery control unit within the battery pack;

discontinuing current flow from battery pack when the voltage potential of any cell is determined by the battery control unit to be below a predetermined minimum voltage during discharge of the battery pack; and reducing the voltage potential stored in any one or more of the cells when a voltage differential between the respective one or more cells and any other one of the cells having a lesser voltage potential is determined by the battery control unit to exceed a predetermined maximum differential during charging of the battery pack;

wherein monitoring the voltage potential for the plurality of cells comprises:

measuring a cumulative voltage potential across all of the cells as the battery pack is discharging;

measuring a cumulative voltage across a sub-set of the cells, the sub-set comprising N number of the cells where the number N is evenly dividable into the total number of cells;

dividing the cumulative voltage potential of all the cells by N to determine a calculated voltage across the sub-set of the cells; and comparing the measured voltage across the sub-set of the cells with the calculated voltage across the sub-set of the cells to obtain a voltage differential.

2. The method of claim 1, further comprising terminating the discharging of the battery pack if the voltage differential is greater than a predetermined threshold.

* * * * *